(12) United States Patent
Low et al.

(10) Patent No.: US 7,472,043 B1
(45) Date of Patent: Dec. 30, 2008

(54) MASS CUSTOMIZATION CONFIGURATOR

(75) Inventors: Andrew G. Low, Southlake, TX (US); Franz T. Crystal, Plano, TX (US)

(73) Assignee: Tellabs Bedford, Inc., Naperville, IL (US)

( * ) Notice: Subject to any disclaimer, the term of this patent is extended or adjusted under 35 U.S.C. 154(b) by 317 days.

(21) Appl. No.: 11/061,097

(22) Filed: Feb. 18, 2005

(51) Int. Cl.
*G06F 17/50* (2006.01)
(52) U.S. Cl. ............... 703/1; 703/18; 702/132
(58) Field of Classification Search ........ 703/1, 703/13, 14, 18; 702/132; 165/104.34
See application file for complete search history.

(56) References Cited

U.S. PATENT DOCUMENTS

| | | | | |
|---|---|---|---|---|
| 5,570,740 | A | * | 11/1996 | Flores et al. ........... 165/104.34 |
| 7,020,586 | B2 | * | 3/2006 | Snevely ........................ 703/1 |
| 7,096,147 | B1 | * | 8/2006 | Low ........................ 702/132 |
| 2003/0158718 | A1 | * | 8/2003 | Nakagawa et al. ............ 703/13 |

OTHER PUBLICATIONS

Hayama et al., H. Airflow Distribution in Telecommunications Equipment Rooms, 12th International Telecommunications Energy Conference, IEEE, Oct. 1990, pp. 206-212.*
Stahl et al., L. Designing an Alternative to Conventional Room Cooling, 23rd Telecommunications Energy Conference, IEEE, Oct. 2001, pp. 109-115.*
Kang et al., S. A Methodology for the Design of Perforated Tiles in Raised Floor Data Centers Using Computational Flow Analysis, IEEE Transactions on Components and Packaging Technologies, vol. 24, No. 2, Jun. 2001, pp. 177-183.*
Kang et al., S. A Methodology for the Design of Perforated Tiles in Raised Floor Data Centers Using Computational Flow Analysis, 7th Intersociety Conference on Thermal and Thermomechanical Phenomena in Electronic Systems, IEEE, May 2000, pp. 215-224.*
Schmidt et al., R.R. Computer and Telecommunications Equipment Room Cooling: A Review of Literature, IEEE Transactions on Components and Packaging Technologies, vol. 26, No. 1, Mar. 2003, pp. 89-98.*
Chu et al., R.C. Review of Cooling Technologies for Computer Products, IEEE Transactions on Device and Materials Reliability, vol. 4, No. 4, Dec. 2004, pp. 568-585.*

* cited by examiner

*Primary Examiner*—Russell Frejd
(74) *Attorney, Agent, or Firm*—Hamilton, Brook, Smith & Reynolds, PC

(57) ABSTRACT

The present invention provides an automated configuration system and method for electronics enclosures. The system receives user requirements generates a configuration including placement schedule, power usage schedules and heat flow schedules. Included as output of the system is a bill of materials, an equipment layout drawing and pricing based on predetermined material and labor pricing. Methods for generating a configuration are described that include iteratively repeating combinations of the steps of generating design rules, deriving a placement schedule, mapping the distribution of power usage within the enclosure and producing a heat flow analysis. Processes used to generate the configuration can be controlled by design rules derived from user requirements.

28 Claims, 4 Drawing Sheets

US 7,472,043 B1

MASS CUSTOMIZATION CONFIGURATOR

BACKGROUND OF THE INVENTION

1. Field of the Invention

The present invention relates to automated configuration of electronics enclosures. The present invention more particularly relates to computer-based systems for configuring enclosures housing telecommunications racks.

2. Description of Related Art

Currently, electronics enclosures such as telecommunications racks are manually configured to meet requirements set by a customer. Systems available for assisting rack configuration merely provide component placement assistance and do not account for requirements drive by functionality, device interoperability or environmental conditions within the rack. However, electronics enclosures must be configured with various electronic sub-racks according to engineering rules for placement of equipment, cooling capability, modules based on traffic loading, vendor equipment preference, and power storage requirements. Additionally, telecommunication service providers (customers) require the electronics within the enclosure to provide a prescribed amount of voice, video, and data traffic. Current systems require significant operator direction and intervention to ensure compliance with device specifications and customer requirements. Thus, current methods for configuring enclosures tend to be time-consuming and labor-intensive and consequently expensive.

BRIEF SUMMARY OF THE INVENTION

The present invention provides an system and method for automated configuration of electronics enclosures. The system typically receives requirements in the form of an initial design and generates a completed design including placement schedule, power usage schedules and heat flow schedules. The system may be adapted to optimize arrangement and selection of components according to customer requirements. The customer requirements are typically communicated to the system using an interactive question-and-answer interface. Included as output of the system is a bill of materials ("BOM"), an equipment layout drawing and pricing based on predetermined material and labor pricing. The system can greatly accelerate the time-to-market for a customized enclosure assembly by reducing the engineering life cycle from days to minutes.

In a typical embodiment of the invention, customer requirements are processed to produce a set of design rules. This set of design rules describe components and power, thermal and cost budgets for the configuration. A database of models typically provides descriptions of the components. A plurality of tools may then be used to parse the design rules and model database in order to place components, calculate power consumption and heat flow characteristics for a proposed design and produce a set of documents as an output.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Embodiments of the present invention will now be described in detail with reference to the drawings, which are provided as illustrative examples so as to enable those skilled in the art to practice the invention. Notably, the figures and examples below are not meant to limit the scope of the present invention. Where certain elements of these embodiments can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

Figure 1:
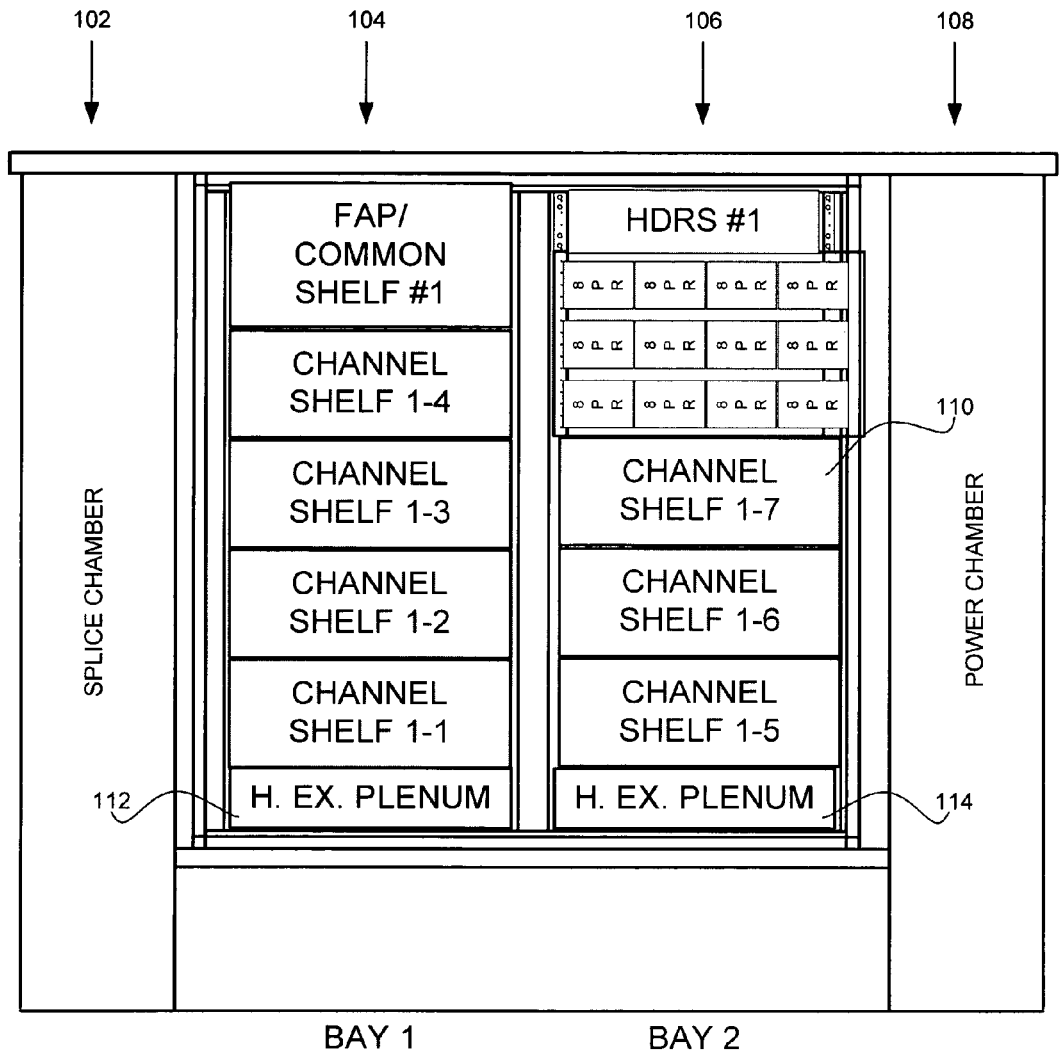
FIG. 1 is a drawing of an electronics enclosure.

The following discussion describes the process for configuring enclosures using an example of a telecommunications rack such as that depicted generally at 100 in FIG. 1. In the example of FIG. 1, the enclosure 100 comprises two bays 104 and 106 and a plurality of shelves (see for example channel shelf 1-7 110) arranged in each of the bays 104 and 106. Such an enclosure 100 further comprises a splicing chamber 102 for managing connections and cables and a power chamber 108 for housing power supplies and power distribution components. Within the bays 104 and 106, plenum areas 112 and 114 are typically provided to facilitate heat exchange and airflow through the enclosure.

Figure 2:
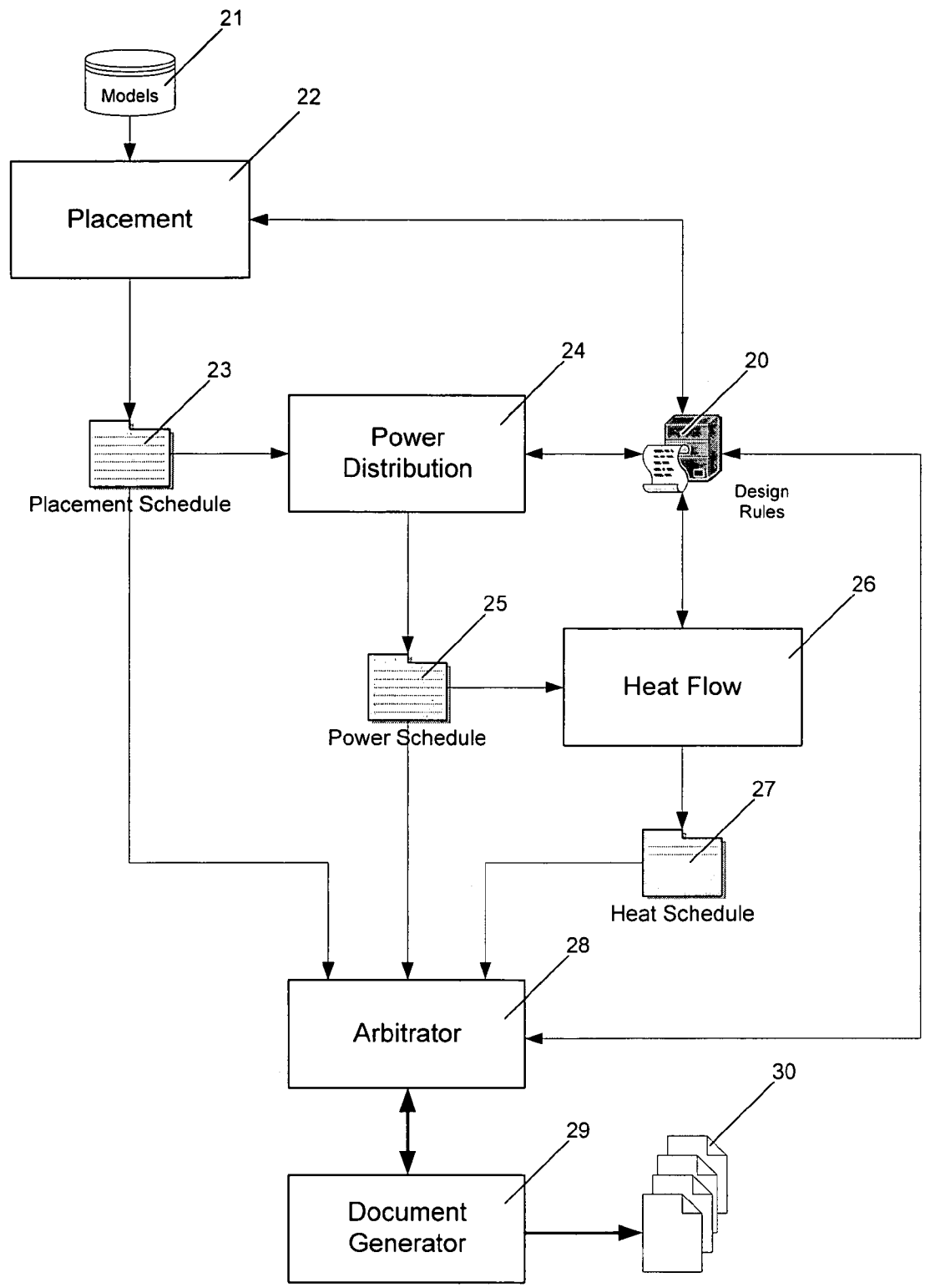
FIG. 2 is a block diagram of a system according to aspects of the invention.

FIG. 2 provides an illustration of an exemplary embodiment of the invention. The embodiment comprises an arbitrator 28 and a plurality of tools including a component placement tool 22, a power distribution tool 24, a heat flow analysis tool 26 and a document generator 29. The arbitrator 28 typically functions as a controller, directing the operation of the plurality of tools. The arbitrator 28 may direct operation of the various tools through a selected set of design rules 20. The design rules 20 typically define characteristics of the user requirements including a list of components, configuration options for an enclosure, performance requirements and specifications, known space constraints within the enclosure, connection capacities associated with the enclosure, component preferences, functional descriptions of components, heat budget, power budget and price budget.

Although the design rules 20 may be manually entered by an operator, many embodiments of the invention provide for automatic creation of the design rules 20 by the arbitrator 28 using customer requirements. The customer requirements are typically communicated to the system using an interactive question-and-answer interface provided on a suitable computing device such as a personal computer, workstation and so on.

It will be appreciated that the exemplary embodiment may be implemented on a variety of available computing platforms including personal computers, workstations, servers and combinations of servers, workstations and personal computers. The computing platforms may use any suitable operating system including Microsoft Windows (e.g. XP, 2000, NT versions), Unix, Linux and so on. Various components of the exemplary embodiment may implemented as custom software programs, commercially available software programs and a plurality of scripts, templates and interfaces to provide a desired functionality. For example, commercially available drafting software such as AutoCAD may be included to produce final drawings in the document generator 29. Further, combinations of commercial databases and spreadsheet software may maintain reports, pricing, rules and other data. In many embodiments collaboration software (such as PTC Windchill) may be used to facilitate information sharing during the design process.

In many embodiments, the arbitrator 28 manages one or more processing cycles, wherein, during each processing cycle, the arbitrator 28 sequentially directs the placement tool 22, the power distribution tool 24 and the heat flow analysis tool 26 to create an iteration of a proposed design including a proposed configuration together with associated power usage information, heat flow analysis information and pricing proposal. The arbitrator 28 compares the proposed design with the design rules 20 and, should the proposed design be consistent with the design rules 20, the arbitrator 28 may direct the document generator 29 to produce documentation describing the proposed design. Where the proposed design is inconsistent with the set of design rules 20, the arbitrator 28 may update the design rules 20 based on the power usage information and heat flow analysis information and may subsequently initiate another processing iteration. Typically, a predetermined number of iterations may be implemented before the arbitrator 28 returns an error message indicating that the proposed design fails to meet one or more of the user requirements.

In many embodiments, design rules 20 are maintained in a database, a file, a data structure, a spreadsheet or in some other suitable storage entity. The design rules 20 include information describing specifications, attributes, options, preferences and limitations of a plurality of components that may be combined to in a preferred configuration of an enclosure of equipment. Typically, the design rules 20 maintain information on components including racks, telecommunications devices, power supplies, batteries, computing systems and wiring panels.

An operator typically creates an initial design configuration on a system or device adapted to communicate with the arbitrator. The operator may initially identify key components and associated components wherein the necessary associated components are required supplemental components related to the key components. For example, a set of cables may be a required supplemental component and it may not be possible for an operator to specify the attributes of the set of cables prior to placement. In some embodiments, the operator may optionally identify a class of component rather than a specific component for inclusion in a configuration. A class of components includes a plurality of devices and combinations of devices that provide equivalent functionality to the specific component. In at least some embodiments, the arbitrator automatically includes supplemental components undefined by the operator but necessitated by the operator's component selections.

The operator may also propose an initial design describing preferred locations for one or more constituents of a preferred design. In some embodiments, the operator provides priorities associated with certain of the constituents. For example, the operator may use priorities to indicate the relative importance of placement of selected components and specify vendors for certain components of the preferred design. Priorities are typically used to govern selection and placement of components based on parameters including vendor preference, manufacturer preference, minimum and maximum traffic levels supported, types of communication service, number of lines served, preferred architecture for racks, size preference for electronics enclosure and type and ampere-hour requirement for energy storage devices.

In many embodiments, the component placement tool 22 receives the design rules 20 (and any initial design) and generates a placement schedule 23 describing equipment placement within an enclosure. The component placement tool 22 typically uses models 21 of components to generate placement layout information, each model describing characteristics and rules associated with a component. Examples of components include telecommunications racks, shelves, power supplies, battery packs, multiplexers, routers and switches. The characteristics of a component described by a model include costs and electrical, mechanical and thermal specifications such as physical dimensions, power consumption, weight, connection capacity, performance statistics, interoperability information and heat dissipation.

The placement tool 22 may assign placement priorities based on characteristics derived from the design rules 20, operator assigned priorities and other optimization information including historical information related to previous designs, prior iterations of a current design, safety information and human factors such as accessibility. The characteristics may include mechanical, electrical and thermal characteristics such as physical size, weight, heat flow and power requirements. Typically the characteristics also include performance specifications such as capacities, throughput, interoperability and supported architectures, Additionally, the characteristics may include pricing data and information necessary to include the associated component in an engineering drawing.

Typically, the design rules 20 also define limitations on placement and use of the component. For example, the rules may include information defining supplemental components that must be used with the component, other components that are incompatible with the component, limitations on proximity to certain other components in the enclosure and restrictions and requirements concerning relative positioning of the component for servicing and other user access.

Figure 3:
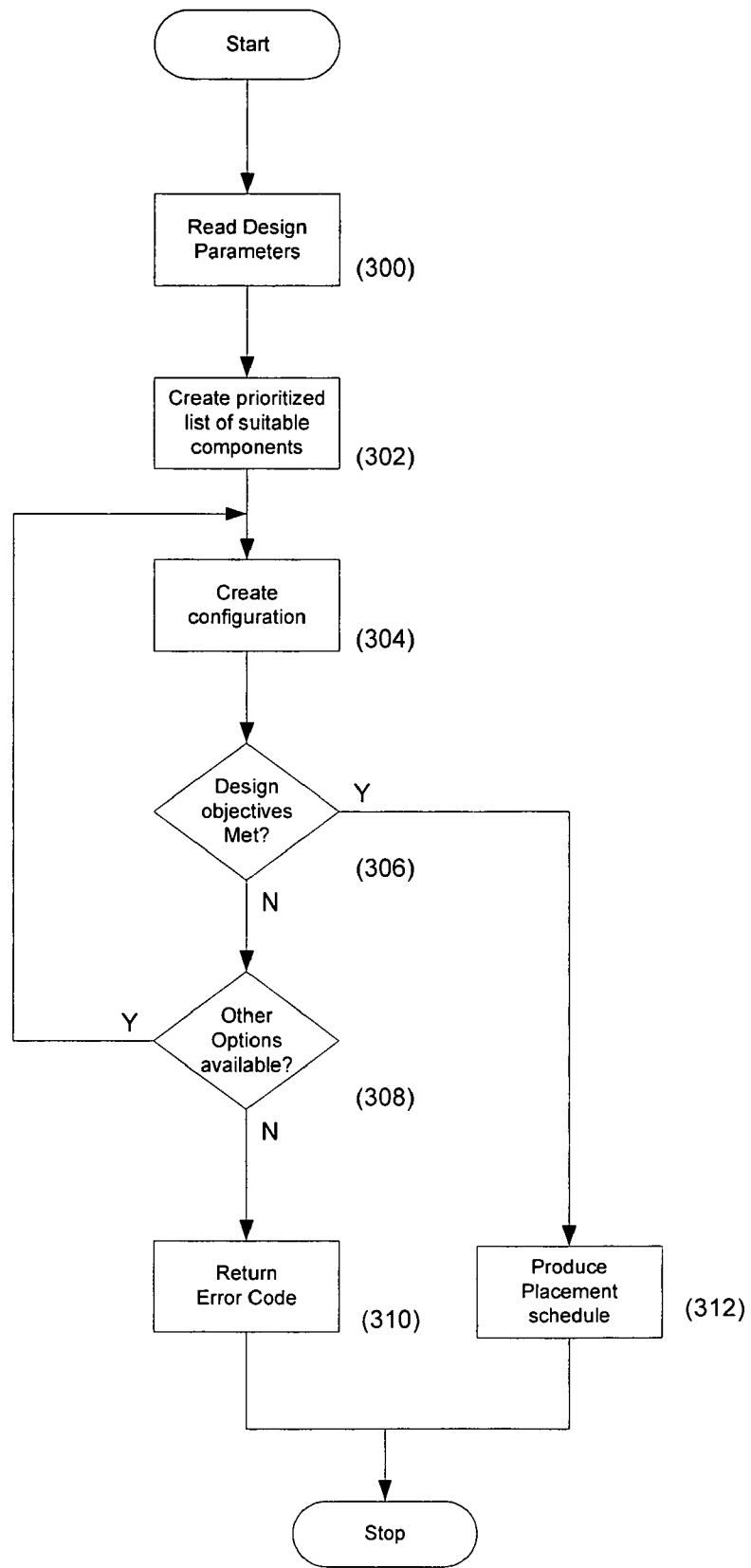
FIG. 3 is a flowchart of the placement process in an exemplary embodiment of the invention.

Referring now also to FIG. 3, a flowchart of a placement process placement in the exemplary embodiment is presented. First, at step 300, design rules 20 are obtained. It may be necessary to query the operator to obtain rules associated with components that are unknown to the system. Typically, the operator is a purchaser, a sales representative or an engineer. The operator may provide responses to design rule queries on a website, by email or using an application installed on any suitable electronic device including personal computers, personal data assistants ("PDA"), wireless communications equipment and telephones.

Next in the example, at step 302, a database containing a plurality of models 21 is parsed for information related to components suitable for inclusion in the enclosure. Each included component may be prioritized according to priorities set by the design rules 20 and added to a prioritized list of usable components. Priorities are typically assigned based on quality of match between of a component and the design rules 20. For example, the prioritized component may exhibit lower performance levels than other similar components yet be attributed a relatively high priority because the component is offered by a preferred vendor. In this latter example, the component would be selected because the proposed design places a higher value on vendor than on performance. Thus, a final set of components may be produced that reflects operator selections and preferences and is adapted according to design rules.

A proposed configuration is created at step 304 from the final set of components. The proposed configuration is typically created to provide a best-fit arrangement of the final set of components. This arrangement preferably allocates a place for each component in one or more racks in a manner consistent with the design rules 20. It will be appreciated that, in some instances, not all selected components will fit in the available space and an appropriate error condition may be indicated.

At step 306 in the example, the proposed configuration is checked for consistency with the set of design rules 20 and for error conditions indicated by the placement tool 22. Where the proposed configuration is found to be unsatisfactory, the arbitrator 28 determines at step 308 whether other configurations and arrangements are possible and another iteration of configuration may be initiated (at step 304). Where the proposed configuration is found to be unsatisfactory and no alternative configurations are considered possible, an error condition may be reported to the arbitrator at step 310. The placement tool 22 typically determines the likelihood of obtaining alternative configurations by weighing a plurality of factors including prior iterations for the same initial design configuration, whether a predetermined maximum number of iterations has been exceeded and whether the availability of alternative components in the prioritized list. Before initiating another iteration, the placement tool 22 typically updates the prioritized list to reprioritize components associated with the failure of a prior iteration. In some embodiments, additional iterations of the placement process may be executed to explore alternative arrangements of components that may offer more optimal solutions. In these embodiments, all satisfactory arrangements are typically recorded and the operator may select one or more of the arrangements to be documented.

When a configuration is found to be acceptable, a placement schedule 23 is typically produced at step 310. The placement schedule 23 provides details of components in the configuration, describes placement of the components (typically in an engineering drawing) and provides an analysis of requirements such as power and cooling requirements. In some embodiments, a reference to a model of each component is also included in the placement schedule 23. Other tools including modeling and drafting tools may directly retrieve information related to the models from the model database 21. The placement schedule 23 may also contain information to facilitate further iterations of placement, such information including an updated prioritized list of components, process logs, error logs and audit trails.

Referring again to FIG. 2, upon creation of a placement schedule 23 the power distribution analysis tool 24 of the exemplary embodiment generates an associated power schedule 25. The power schedule calculates power requirements for each of the components contained in the placement schedule 23. The power schedule 25 is typically used to map the distribution and usage of power under maximum load in order to analyze heat flow in the configured enclosure. In many embodiments, the plurality of models 21 include power ratings for each component, including voltage and current requirements. Thus the power schedule 25 provides information used in performing heat flow analysis and energy storage requirements. For example, the power schedule 25 typically provides information that can be used to calculate battery capacity required to maintain operation of certain of the components in the event of power supply failure. Further the power distribution analysis tool 24 may update the designed configuration 20, causing the arbitrator 28 to create a new placement.

Figure 4:
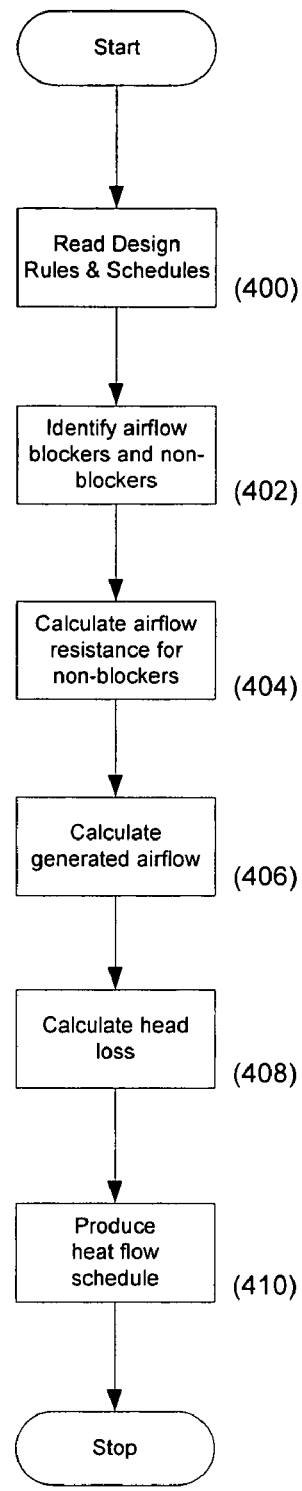
FIG. 4 is a flowchart of the heat flow calculation process in an exemplary embodiment of the invention.

Referring now to FIG. 4 and with reference to FIG. 2, an exemplary process followed by the heat flow analysis tool 26 is shown in the flowchart of FIG. 4. At step 400, the heat flow analysis tool 26 typically receives information related to an enclosure configuration, including a placement schedule 23, a component list, the design rules 20 and models 21 of components identified by the command list. The heat flow analysis tool may build a representation of the enclosure that describes relationships between components of the enclosure, including heat sources, airflow generators, airflow resistance characteristics and airflow blocking. The representation may be of a form manipulable by the heat flow analysis tool 26, forms of representation including schematic diagrams and mathematical models. In some embodiments, the placement tool 22 may provide at least a portion of the representation to the heat flow analysis tool 26.

At step 402, the heat flow analysis tool 26 typically identifies features of individual components that may have significant impact on heat flow in the enclosure. For example, components may be grouped as blockers and non-blockers wherein a blocker impedes a predetermined portion of air impinging on the blocker component. In some embodiments, blockers are identified as having a high airflow resistance. Other features that may be used to group components include heat sources and airflow sources.

Having identified non-blockers, airflow resistance is calculated at step 404. The airflow resistance typically contributes to pressure loss and associated volume of air flow through or past a component. The airflow resistance may vary according to a plurality of factors including angle of incidence of a stream of air, physical structure of a component, configuration of a component (such as whether a printed circuit card is fully populated) and position of a component relative to another component. Typically, the heat flow analysis tool 26 obtains base information from models and placement schedule. Additionally, at step 406, airflow generated in the system is calculated based on the location quantity and specifications of airflow sources.

At step 408, the heat flow analysis tool 28 calculates airflow in the enclosure and generates a heat flow schedule. In some embodiments, calculation of airflow may involve a process that iteratively approximates airflow at predefined positions in an enclosure. In these embodiments, the iterative approximations account for the presence of multiple airflow sources, differentials in pressure caused by multiple airflow paths and variations in airflow resistance attributable to air flow incidental upon a heat generator. In other embodiments, tabular information is used to provide approximations of airflow based on accumulated empirical data. Airflow measurements are typically expressed as head losses at various points in the system. For example, in an enclosure where a single airflow source is provided, the difference in volume of air flowing every second past two points in an enclosure may be expressed as a head loss between the two points.

At step 410, the heat flow analysis tool 28 produces a heat flow schedule 27. The heat flow schedule 27 may be provided as an airflow analysis showing volume of air flowing at each component in the enclosure. In many embodiments, the airflow analysis may also include information for calculating a heat capacity of the airflow at each component of the enclosure. Thus, in at least some embodiments, the heat flow analysis tool 28 combines heat generation information for each component with airflow information to generate a map of temperature gradients in the enclosure.

Referring again to FIG. 2, the arbitrator 28 receives the placement schedule 23, the power schedule 25 and the heat schedule 27 and other relevant information including the design rules 20, a list of components and models of components in the list. The arbitrator 28 typically determines whether the configuration meets user requirements obtained from the operator. The determination may include a consideration of operator-provided factors including cost, capacity, performance and power consumption. The determination may also reflect failure of the configuration to meet operating limits of components of the configuration including, for example, maximum ambient temperature, maximum power dissipation, minimum required airflow and minimum available connection capacity. In many embodiments, the arbitrator 28 may cause initiation of a new design iteration where a determination is made that a configuration does not adequately meet design requirements.

A document generation tool 29 is typically provided to receive a placement schedule 23, a power schedule 25, a heat schedule 27 and other related information including design rules 20, a list of components and models of components in the list. The document generation tool 29 typically causes the producing of documents necessary to the generation of a proposal. The proposal may include a combination of documents such as a pricing schedule, a schematic drawing of the enclosure showing interconnection of components, assembly drawings of the enclosure and list of components organized as a bill of materials. The proposal may also include terms and conditions, estimates of labor required and estimates of delivery dates. Drawings are typically provided in a preferred format. Formats include binary files adapted for selected drafting software (such as AutoCAD), in printable form and any suitable format that may be viewed by a customer.

It is apparent that the above embodiments may be altered in many ways without departing from the scope of the invention. Further, the invention may be expressed in various aspects of a particular embodiment without regard to other aspects of the same embodiment. Still further, various aspects of different embodiments can be combined together. Accordingly, the scope of the invention should be determined by the following claims and their legal equivalents.

What is claimed is:

1. A method for automatically configuring an electronics enclosure from requirements provided by a user, the user requirements including characteristics of a desired enclosure configuration, the method comprising:
   generating design rules from the user requirements, the design rules including information describing attributes of a plurality of components to be assembled in an enclosure and specified operating limits associated with at least one of the plurality of components;
   deriving a placement schedule from the design rules, the placement schedule identifying a placement location for each of the plurality of components within the enclosure;
   mapping a distribution of power usage within the enclosure based on the placement schedule and power requirements of the plurality of components to produce a mapped distribution of power usage, the power requirements being provided in the design rules;
   producing a heat flow analysis based on the mapped distribution of power usage and the placement schedule, producing the heat flow analysis including identifying heat sources and airflow characteristics of each of the plurality of components to be assembled; and
   iteratively repeating the deriving, mapping and producing to generate an enclosure configuration consistent with the design rules.

2. The method of claim 1 wherein the design rules are modified after each iterative repetition of the deriving, mapping and producing.

3. The method of claim 1, wherein the design rules include functional descriptions of components, a heat budget, a power budget and a price budget for portions of the enclosure.

4. The method of claim 1 wherein deriving a placement schedule includes obtaining specifications of the plurality of components from a database of models, the specifications including physical dimensions, power consumption and heat dissipation characteristics.

5. The method of claim 1, wherein producing a heat flow analysis includes:
   identifying airflow-blocking components;
   calculating airflow resistances for airflow-resisting components; and
   calculating head loss associated with an airflow in the enclosure representing a loss of pressure and associated volume of the airflow, wherein the head loss is calculated based on the calculated airflow resistances.

6. The method of claim 5, wherein producing a heat flow analysis further includes obtaining a map of temperature gradients in the enclosure associated with each component;
   calculating heat capacity of airflow proximate to the each component; and
   combining heat generation information for the each component with the heat capacity.

7. The method of claim 1, further comprising generating documentation describing the generated enclosure configuration, the documentation including component lists and assembly drawings.

8. A system for automatically configuring an electronics enclosure consistent with requirements provided by a user, the system comprising:
   a plurality of models describing the electrical, mechanical and thermal characteristics of an associated plurality of components;
   a placement tool to generate a placement schedule based on selected models in the database, the selected models corresponding to components identified in the requirements;
   a power distribution tool for to generate a power distribution schedule based on the placement schedule and power consumption information provided by the selected models;
   a heat flow tool to generate a heat schedule based on the placement schedule, the power distribution schedule, and placement limitations identified in the selected models;
   an arbitrator to compare the placement schedule, the power distribution schedule and the heat schedule with the requirements and optionally initiating one or more additional iterations of the placement tool, the power distribution tool and the heat flow tool to obtain a placement schedule consistent with the requirements, the requirements including specified operating limits associated with one or more of the associated plurality of components; and
   a document generation tool to provide the placement schedule to the user.

9. The system of claim 8, wherein the arbitrator is further configured to create design rules prior to processing by the placement tool the design rules defining characteristics of the requirements, the characteristics including a listing of preferred components, configuration options for the enclosure, performance requirements and specifications desired of the configured enclosure, space constraints within the enclosure, connection capacities associated with the enclosure, heat, power and price budget for the configured enclosure.

10. The system of claim 9, wherein the arbitrator is further configured to update the design rules in response to information generated by the placement, power distribution and heat flow tools.

11. The system of claim 8, wherein the arbitrator initiates no more than a predefined maximum number of reconfigurations.

12. The system of claim 10, wherein the arbitrator is further configured to optimize the placement schedule using the updated design rules, and wherein the document generation tool provides an optimized placement schedule.

13. The system of claim 12 wherein the documents include information related to pricing.

14. The system of claim 12 wherein the documents include representations of the placement, power distribution and heat schedules.

15. The system of claim 12, wherein the documents include calculated mechanical, electrical and thermal specifications.

16. The system of claim 12, wherein the documents include a bill of materials.

17. A method for configuring a telecommunications rack, the method comprising:
    selecting placement locations in the telecommunications rack for at least some of a plurality of components, wherein each placement location is selected based on operating characteristics of the plurality of components;
    mapping a power distribution for the enclosure based on power requirements and the placement locations;
    producing a heat flow schedule based on the mapped power distribution and the placement locations, the heat flow schedule identifying heat sources in the telecommunications rack and airflow characteristics of the at least some of the plurality of components; and
    iteratively repeating the selecting, mapping and producing to obtain a configured telecommunications rack conforming to a set of predetermined design rules, wherein the design rules include specified operating limits associated with one or more of the plurality of components.

18. The method of claim 17, wherein the telecommunications rack comprises a plurality of bays each bay having one or more shelves.

19. The method of claim 18, wherein the telecommunications rack further comprises a splicing chamber for managing connections and cables.

20. The method of claim 19, and further comprising selecting cables for installation in the telecommunications rack based on the placement locations and the design rules.

21. The method of claim 17, and further comprising prioritizing the plurality of components for placement based on priorities set by the design rules.

22. The method of claim 17, wherein selecting placement locations includes determining optimized locations for the at least some components based on historical information.

23. The method of claim 22, wherein the historical information includes information obtained from previous telecommunications rack configurations and information derived from prior iterations of the selecting, mapping and producing.

24. The method of claim 22, wherein selecting placement locations further includes determining optimized locations for the at least some components based on safety and human factor information.

25. The method of claim 1, wherein the electronics enclosure comprises a telecommunications rack.

26. The method of claim 1, wherein the operating limits associated with one or more of the plurality of components comprise maximum ambient temperatures for one or more of the plurality of components.

27. The method of claim 1, wherein the electronics enclosure comprises a plurality of bays, each bay having one or more shelves.

28. The method of claim 7, wherein the documentation further includes a proposal comprising terms and conditions, estimates of labor and estimates of enclosure delivery dates.

* * * * *